US009029250B2

(12) United States Patent
Konrath et al.

(10) Patent No.: US 9,029,250 B2
(45) Date of Patent: May 12, 2015

(54) METHOD FOR PRODUCING SEMICONDUCTOR REGIONS INCLUDING IMPURITIES

(71) Applicant: Infineon Technologies Austria AG, Villach (AT)

(72) Inventors: Jens Peter Konrath, Villach (AT); Ronny Kern, Villach (AT); Hans-Joachim Schulze, Taufkirchen (DE)

(73) Assignee: Infineon Technologies Austria AG, Neubiberg (DE)

( * ) Notice: Subject to any disclaimer, the term of this patent is extended or adjusted under 35 U.S.C. 154(b) by 0 days.

(21) Appl. No.: 14/035,185

(22) Filed: Sep. 24, 2013

(65) Prior Publication Data

US 2015/0087129 A1 Mar. 26, 2015

(51) Int. Cl.
*H01L 21/265* (2006.01)
*H01L 29/36* (2006.01)

(52) U.S. Cl.
CPC .................................... *H01L 29/36* (2013.01)

(58) Field of Classification Search
USPC .................... 257/E21.057, E21.059, E21.12, 257/E21.147, E21.248; 438/369, 373, 407, 438/440, 450, 506, 514, 519, 527
See application file for complete search history.

(56) References Cited

U.S. PATENT DOCUMENTS

| 5,362,980 | A * | 11/1994 | Gough | 257/355 |
| 2004/0009643 | A1* | 1/2004 | Blanchard | 438/268 |
| 2005/0042830 | A1* | 2/2005 | Blanchard | 438/268 |

* cited by examiner

*Primary Examiner* — Asok K Sarkar
(74) *Attorney, Agent, or Firm* — Murphy, Bilak & Homiller, PLLC

(57) ABSTRACT

A method for producing semiconductor regions including impurities includes forming a trench in a first surface of a semiconductor body. Impurity atoms are implanted into a bottom of the trench. The trench is extended deeper into the semiconductor body, thereby forming a deeper trench. Impurity atoms are implanted into a bottom of the deeper trench.

20 Claims, 9 Drawing Sheets

METHOD FOR PRODUCING SEMICONDUCTOR REGIONS INCLUDING IMPURITIES

TECHNICAL FIELD

Embodiments of the present invention relate to a method for producing semiconductor regions including impurities, in particular regions that may extend deep into a semiconductor body.

BACKGROUND

Several types of semiconductor devices include a doped semiconductor region that extends relatively deep into a semiconductor body and forms a vertical pn junction with an adjoining semiconductor region. A "vertical pn junction" is a pn junction that substantially extends in a vertical direction of the semiconductor body, which is a direction perpendicular to a main surface, such as a front surface or a rear surface, of the semiconductor body. For example, a superjunction transistor includes compensation regions that extend deep into a drift region and form vertical pn junctions with the drift region. In a JFET (Junction Field-Effect Transistor), a source region can be implemented to extend deep into a semiconductor body and form a pn junction with a body region.

Compensation regions of a superjunction device can be produced using a multiple epitaxy process. In this process, a layer stack is formed by producing several epitaxially grown layers above one another, and introducing dopant atoms into each layer in a masked implantation process. An annealing process after the end of the multiple epitaxy process causes the implanted dopant atoms to diffuse in the layer stack with and to be activated, thereby forming the compensation regions. A multiple epitaxy process, however, is expensive.

A source region of a JFET can be formed by etching a trench into a channel region (i.e. a body region) of the JFET and by implanting dopant atoms either into sidewalls of the trench or into a mask layer from where they are scattered into the sidewalls. However, this sequence requires forming a deep source region requires a wide trench for, and may not be very efficient.

There is therefore a need to provide an efficient and economic method for producing a doped region, in particular a doped region that extends deep into a semiconductor body.

SUMMARY

According to an embodiment, a method includes forming a trench in a first surface of a semiconductor body, implanting impurity atoms into a bottom of the trench, extending the trench deeper into the semiconductor body, thereby forming a deeper trench, and implanting impurity atoms into a bottom of the deeper trench.

BRIEF DESCRIPTION OF THE DRAWINGS

Examples are explained below with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

FIGS. 1A-1E illustrate one embodiment of a method for producing a semiconductor region including impurity atoms in a semiconductor body 100. According to one embodiment, the impurity atoms are doping atoms so that the method is, in particular, suitable for forming a doped semiconductor region that extends deep into the semiconductor body 100. For example, the doped semiconductor region may extend deeper than 1 micrometer ($\mu m$), or even deeper than 10 micrometers into the semiconductor body 100.

Figure 1A:
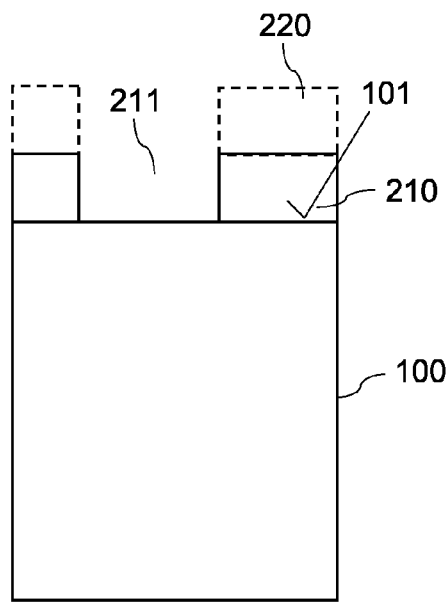
FIGS. 1A-1E illustrate one embodiment of a method for producing a semiconductor region in a semiconductor body.

Referring to FIG. 1A, the method includes forming a mask 210 on a first surface 101 of the semiconductor body 100. In FIG. 1A, only one section of the semiconductor body 100 is illustrated, namely that section in which the doped semiconductor region is to be produced. FIGS. 1A-1E show a vertical cross-sectional view of the semiconductor body 100, that is a view in a section plane perpendicular to the first surface 101. The semiconductor body 100 may include a conventional semiconductor material, such as silicon (Si), silicon carbide (SiC), gallium nitride (GaN) or gallium arsenide (GaAs).

The mask 210 is, for example, a hard mask, such as an oxide hard mask or a nitride hard mask. The mask 210 includes an opening 211 where the first surface 101 is uncovered. The mask 210 can be structured in a conventional way in order to form the opening. Structuring the mask may include, for example, using a photo resist 220 (illustrated in dashed lines in FIG. 1A).

Figure 1B:
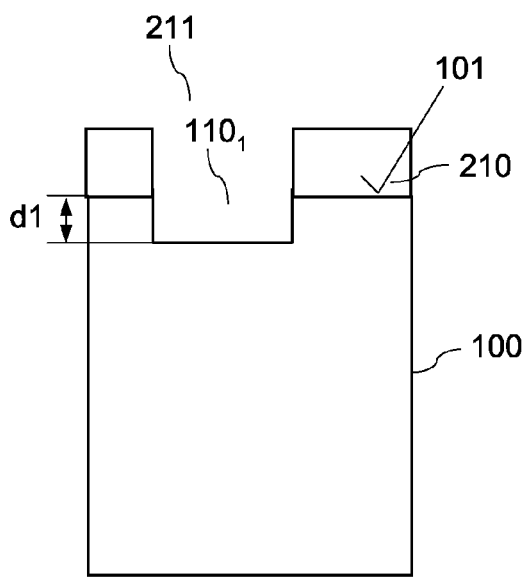

Referring to FIG. 1B, the method includes forming a trench $110_1$ in the first surface 101 of the semiconductor body 100 using the mask 210. Forming the trench $110_1$ may include an etching process, such as an anisotropic etching process, in which those regions of the semiconductor body 100 that are uncovered in the opening 211 of the mask 210 are etched. A depth $d_1$ of this trench $110_1$ may be, for example, dependent on a duration of the etching process, wherein the depth $d_1$ increases as a duration of the etching process increases. In the embodiment shown in FIG. 1B, the trench $110_1$ has substantially vertical sidewalls, which are sidewalls substantially perpendicular to the first surface 101. However, this is only an example. It is also possible to produce the trench $110_1$ with beveled (tapered) sidewalls (not illustrated).

Figure 1C:
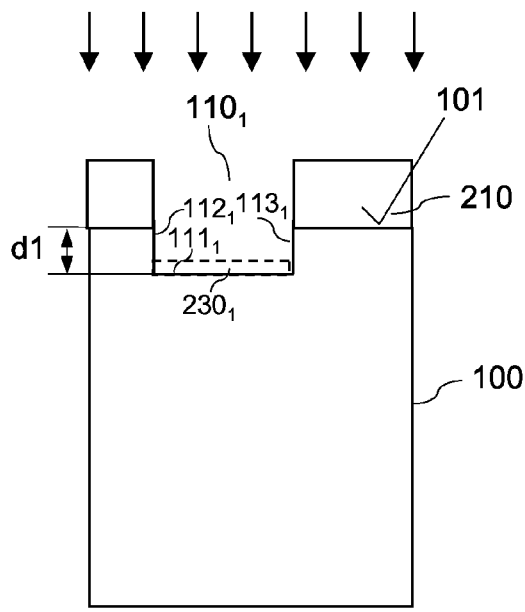

Referring to FIG. 1C, the method further includes implanting impurity atoms into a bottom $111_1$ of the trench $110_1$. For the purpose of explanation, it is assumed that the impurity atoms are doping atoms (dopants). According to one embodiment, implanting the dopant atoms includes an implantation process in which the dopant atoms are implanted in a direction that substantially corresponds to a vertical direction of the semiconductor body 100, which is a direction perpendicular to the first surface 101 and substantially perpendicular to the bottom $111_1$ of the trench $110_1$. An implant region $21_1$, which is a region of the semiconductor body 100 into which the dopant atoms have been implanted, extends in the vertical direction of the semiconductor body 100 below the bottom $111_1$ of the trench, but also extends beyond sidewalls $112_1$, $113_1$ of the trench $110_1$. That is, the implant region $21_1$ is wider than the trench $110_1$. This is due to a lateral straggling of the implanted dopant atoms. That is, some of the dopant atoms that are implanted into the bottom $111_1$ of the trench move in a lateral direction, which is a direction perpendicular to the vertical direction. This even occurs when the dopant atoms are implanted verti-cally.

Referring to FIG. 1B, the trench $110_1$ is extended deeper into the semiconductor body 100 so as to form a deeper trench $110_2$. Extending the trench $110_1$ deeper into the semiconductor body 100 may include an etching process, such as an anisotropic etching process. The mask 210 may remain on the first surface 101 after forming the trench $110_1$ (as shown in FIG. 1B) and may be used again in the etching process that extends the trench $110_1$ deeper into the semiconductor body 100.

Figure 1D:
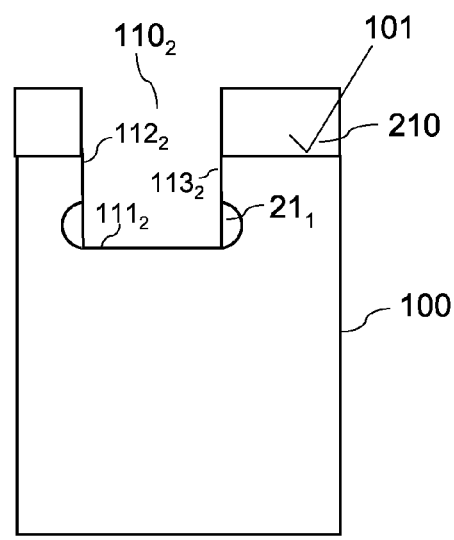

The deeper trench $110_2$ may extend into the implant region $21_1$ such that a bottom $111_2$ of the deeper trench $101_2$ is within the implant region $21_1$, or substantially corresponds to a lower border of the implant region $21_1$ (as shown in FIG. 1D). However, according to further embodiments explained below, it is also possible to produce the deeper trench $110_2$ such that it completely extends through the implant region $21_1$.

Figure 1E:
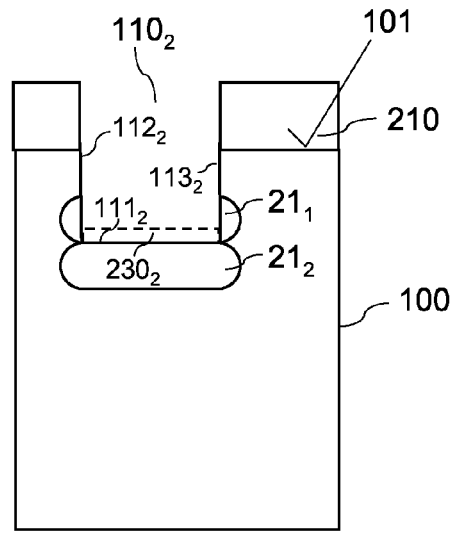

Referring to FIG. 1E, the method further includes implanting dopant atoms into the bottom $111_2$ of the deeper trench $110_2$ so as to form a further implant region $21_2$. This further implant region $21_2$ adjoins the implant region $21_1$ formed before when the deeper trench $110_2$ has been produced such that it does not completely extend through the implant region $21_1$.

At least one of implanting dopant atoms into the bottom $111_1$ of the trench $110_1$, and implanting dopant atoms into the bottom $111_2$ of the deeper trench $110_2$ may include at least two implantation processes, wherein dopant atoms are implanted with different implantation energies in these different implantation processes. According to one embodiment, an overall implantation dose of the dopants implanted into the bottom $111_1$ is between $1 \times 10^{10}$ cm$^{-2}$ and $1 \times 10^{15}$ cm$^{-2}$, and in particular between $1 \times 10^{11}$ cm$^{-2}$ and $1 \times 10^{14}$ cm$^{-2}$.

According to one embodiment, a scattering layer $230_1$, $230_2$ is formed at least on one of the bottom $111_1$ of the trench $110_1$, and the bottom $111_2$ of the deeper trench $110_2$ before implanting the dopant atoms. This scattering layer $230_1$, $230_2$ is illustrated in dashed lines in FIGS. 1C and 1E. The scattering layer $230_1$, $230_2$ supports a scattering of the implanted dopant atoms in the lateral direction of the semiconductor body 100. In FIGS. 1C and 1E, the scattering layer $230_1$, $230_2$ is only produced on the bottom $111_1$, $111_2$ of the trenches $110_1$, $110_2$. However, this is only an example. The scattering layers $230_1$, $230_2$ could also be produced on the sidewalls of these trenches. According to one embodiment, the scattering layer $230_1$, $230_2$ includes an oxide, such as a thermally grown oxide, or a deposited oxide. The scattering layer $230_1$, $230_2$ can be removed after the implantation of the dopant atoms using a conventional etching process. According to one embodiment, the etching process that etches the trench $110_1$ deeper into the semiconductor body 100 also removes the scattering layer $230_1$.

The process explained before is not restricted to produce only two implant regions $21_k$, $21_2$, as shown in FIG. 1E. According to one embodiment, the process of extending the trench deeper into the semiconductor body 100 to obtain a deeper trench, and the process of implanting dopant atoms into a bottom of the deeper trench is repeated at least once. That is, the (deeper) trench $110_2$ shown in FIG. 1E may be extended deeper into the semiconductor body 100 either into the implant region $21_2$, or through the implant region $21_2$, and dopant atoms may be implanted into the bottom of the deeper trench obtained in this way.

Figure 2:
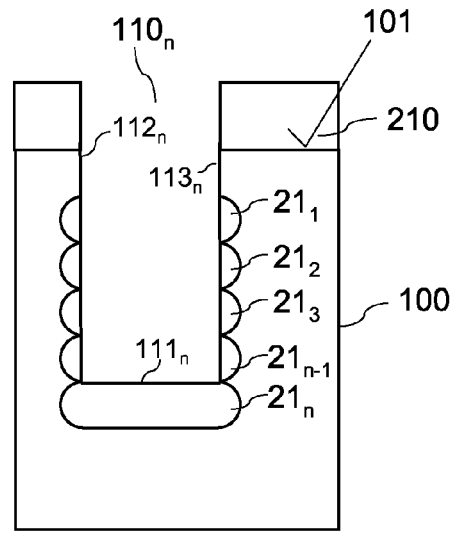
FIG. 2 illustrates a semiconductor body obtained by repeating the method steps explained with reference to FIGS. 1A-1E several times.

FIG. 2 shows a vertical cross-sectional view of a semiconductor body 100 that includes n implant regions $21_1$-$21_n$ that adjoin a deeper trench $110_n$ having a bottom $111_n$. This semiconductor topology can be obtained by performing the processes explained with reference to FIGS. 1D and 1E n−1 times. That is, based on the topology shown in FIG. 1C that includes the trench $110_1$ and an implant region $21_1$ (that will be referred to as first implant region $21_1$ in the following), the trench $110_1$ is extended deeper into the semiconductor body 100 n−1 times, and dopant atoms are implanted into the bottom of the extended trench (of deeper trench) after each exten-sion process. That is, the process steps explained with reference to FIGS. 1D and 1E are repeated n−2 times. One or more of these implantation processes may include two or more implantation steps in which dopant atoms are implanted at different implantation energies. Further, a scattering layer may be produced at least on the bottom of the trench before an implantation process.

The method explained before generates at least two implant regions at different vertical positions of a semiconductor body 100. The individual implant regions can be produced with equal implantation doses or with different implantation doses. According to one embodiment, the same doping type (n-type or p-type) is used for the individual implant regions. According to another embodiment, at least one of the implant regions is includes dopants of a first doping type (n-type or p-type), and at least another one of the implant regions includes dopants of a second doping type complementary to the first doping type. According to one embodiment, implant regions including the first doping type and implant regions including the second doping type are produce alternatingly. In the latter case, the resulting doped region 20 alternatingly includes n-type and p-type semiconductor regions.

The implant regions of one doping type (n-type or p-type) can be produced using the same type of doping material, such as arsenic, phosphorous, or selenium in case of n-type implant regions, or boron or aluminum in case of p-type implant regions. However, it is even possible, to use different doping materials in the individual implant regions of one doping type.

Figure 3:
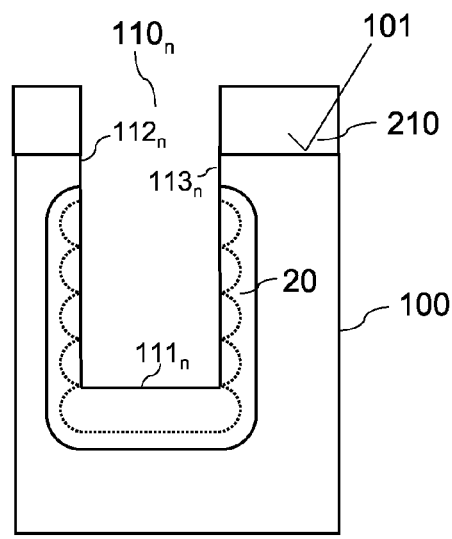
FIG. 3 illustrates the semiconductor body shown in FIG. 2 after an annealing process.

Referring to FIG. 3, an annealing process can be performed after the individual implant regions have been produced. FIG. 3 shows a semiconductor body 100 with n implant regions $21_1$-$21_n$, wherein n is more than 2 (specifically n=5) in this case. However, it is also possible to produce only n=2 implant regions. The implant regions $21_1$-$21_n$ are illustrated in dashed lines in FIG. 3. Referring to FIG. 3, the annealing process causes the dopant atoms in the individual implant regions $21_1$-$21_n$ to diffuse deeper into the semiconductor body 100 and to be activated. The result of this annealing process is a doped semiconductor region 20 adjoining the bottom $111_n$ and the sidewalls $112_n$, $113_n$ of the trench $110_n$. A doping profile of this semiconductor region 20 in the vertical direction along the sidewalls $112_n$, $113_n$ is dependent on the dopant doses of the individual implant regions $21_1$-$21_n$. According to one embodiment, the implant regions $21_1$-$21_n$ are produced with substantially equal implantation doses. In this case, a doping concentration of the doped semiconductor region 20 is substantially constant along a line extending in the vertical direction of the semiconductor body 100. A varying doping profile of the doped semiconductor region 20 can be obtained by producing individual implant regions $21_1$-$21_n$ with different dopant doses.

In the embodiment shown in FIG. 2, an n-th implant region $21_n$ adjoins the bottom $111_n$ of the deeper trench $110_n$. Consequently, the doped semiconductor region 20 also adjoins the bottom $111_n$ of the trench $110_n$. That is, the doped semiconductor region 20 is partially located below the bottom $111_n$ of the trench $110_n$.

Figure 4:
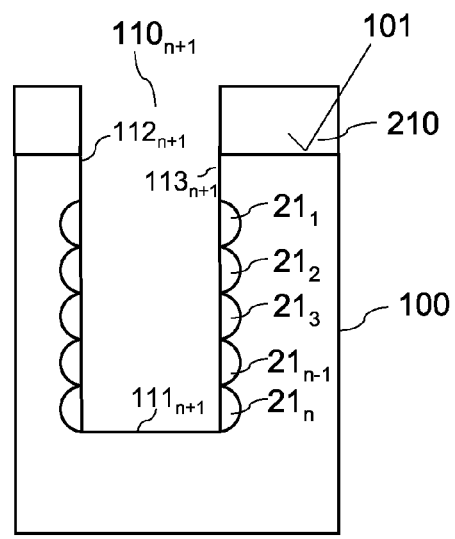
FIG. 4 illustrates a vertical cross-sectional view of a semiconductor body obtained in accordance with a further method.

According to one embodiment, the deepest implant region, which is implant region $21_n$ in the embodiment shown in FIG. 2, is removed below the bottom $111_n$ of the trench $110_n$. Referring to FIG. 4, this can be obtained by extending the trench $110_n$ deeper into the semiconductor body 100 such that it completely extends through the deepest implant region $21_n$, which is the implant region formed in the last implantation process. The resulting trench is labelled with reference character $110_{n+1}$ in FIG. 4. In this embodiment, the deepest implant region $21_n$, like the other implant regions $21_1$-$21_{n-1}$, only remains along sidewalls $112_{n+1}$, $113_{n+1}$ of the trench $110_{n+1}$.

Figure 5:
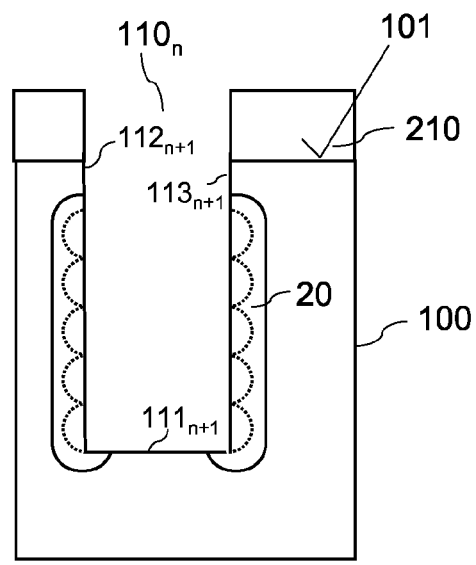
FIG. 5 illustrates the semiconductor body shown in FIG. 4 after an annealing process.

FIG. 5 illustrates the semiconductor topology shown in FIG. 4 after an annealing process. In this case, the doped semiconductor region 20 includes elongated sections each extending in the vertical direction of the semiconductor body 100 along one sidewall.

Figure 6A:
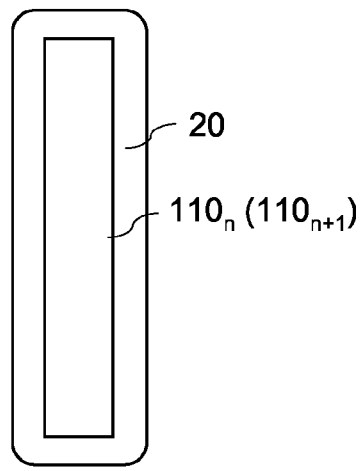
FIGS. 6A-6C show horizontal cross sectional views of different embodiments of doped semiconductor regions.
Figure 6B:
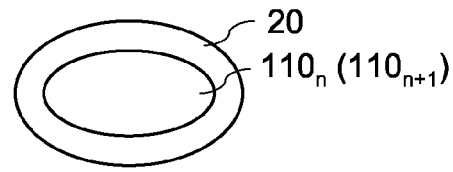
Figure 6C:
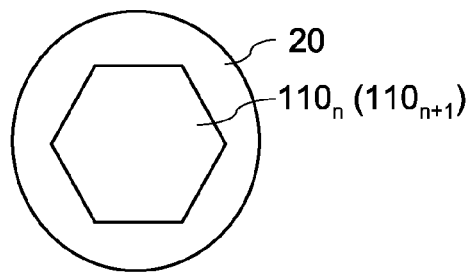

In a horizontal section plane of the semiconductor body 100, a shape of the doped semiconductor regions 20 explained herein before is dependent on the shape of the trench $110_n$, and $110_{n+1}$, respectively. This trench may vary in shape. As shown in FIG. 6A, a vertical cross-sectional view of the semiconductor body 100 in a section plane A-A shown in FIGS. 3 and 5, the trench $110_n$, $110_{n+1}$ can be a rectangular trench. It is even possible to produce the trench $110_n$, $110_{n+1}$ as an elongated rectangular trench. Referring to FIG. 6B, the trench $110_n$, $110_{n+1}$ can have an elliptical or circular shape, and referring to FIG. 6C, the trench $110_n$, $110_{n+1}$ can have a polygonal shape, in particular a hexagonal shape.

In the embodiments explained before, the trench is not extended deeper into the semiconductor body 100 than the implant region produced directly before extending the trench deeper into the semiconductor body. For example, in the embodiment shown in FIG. 1D, the deeper trench $110_2$ extends into the first implant region $21_1$ or ends at a lower border of the implant region $21_1$.

Figure 7:
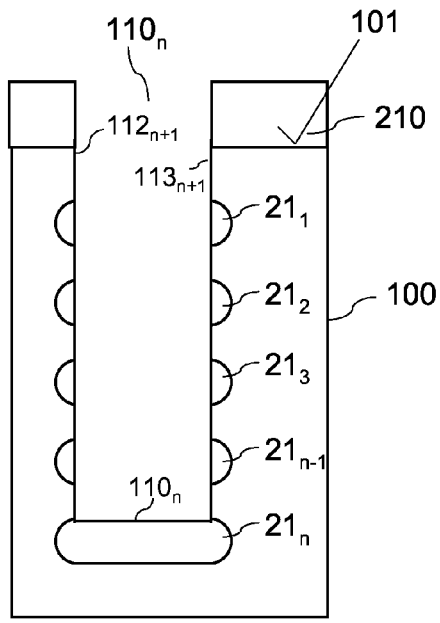
FIG. 7 illustrates a vertical cross-sectional view of a semiconductor body obtained in accordance with a further method.

According to a further embodiment, the trench is extended such that it completely extends through the implant region directly produced before. A vertical cross-sectional view of a semiconductor topology obtained through this is shown in FIG. 7. In this embodiment, the individual implant regions $21_1$-$21_n$ are mutually spaced in a vertical direction of the trench $110_n$. Although not shown in FIG. 7, the deepest implant region $21_n$ can be removed below the bottom $111_n$ of the trench $110_n$.

Figure 8:
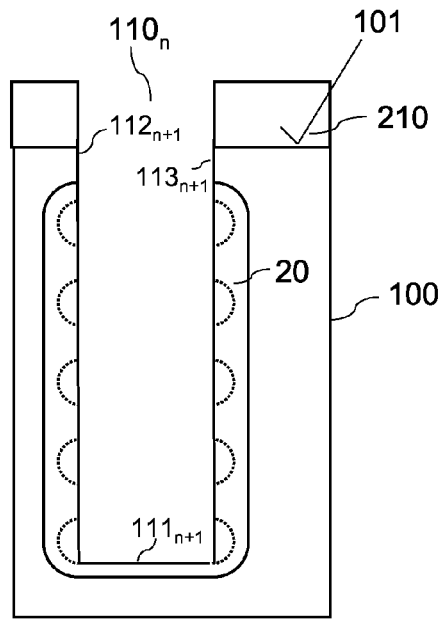
FIG. 8 illustrates the semiconductor body shown in FIG. 7 after an annealing process.
Figure 9:
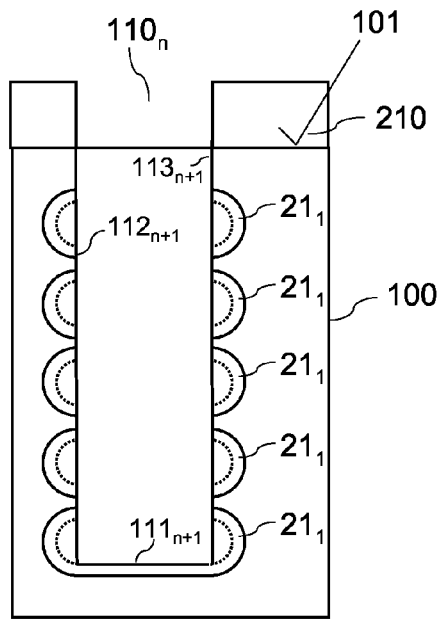
FIG. 9 illustrates the semiconductor body shown in FIG. 7 after an annealing process.

FIGS. 8 and 9 show vertical cross-sectional views of the semiconductor topology of FIG. 7 after annealing processes in which the implanted dopant atoms are activated and a doped semiconductor region 20 adjoining the trench $110_n$ is formed. In the embodiment shown in FIG. 8, the doped semiconductor region 20 is a continuous semiconductor region, while in the embodiment shown in FIG. 9, the semiconductor region 20 includes several doped regions $20_1$-$20_n$, that are mutually spaced in a vertical direction of the semiconductor body 100. Whether the semiconductor region 20 is a continuous region or includes several doped sections $20_1$-$20_n$ is dependent on the vertical distance of the implant regions $21_1$-$21_n$, and on the duration of the annealing process. When the distance is relatively low and/or when the annealing process is relatively long, the individual implant regions $21_1$-$21_n$ form a continuous doped region 20. When the distance is relatively large and/or when the annealing process is relatively short, several spaced apart regions $20_1$-$20_n$ are formed.

Figure 10A:
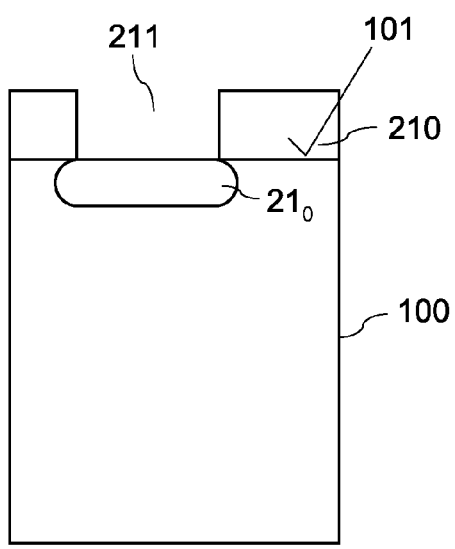
FIG. 10A-10B illustrate a further embodiment of a method for producing a doped semiconductor region in a semiconductor body.
Figure 10B:
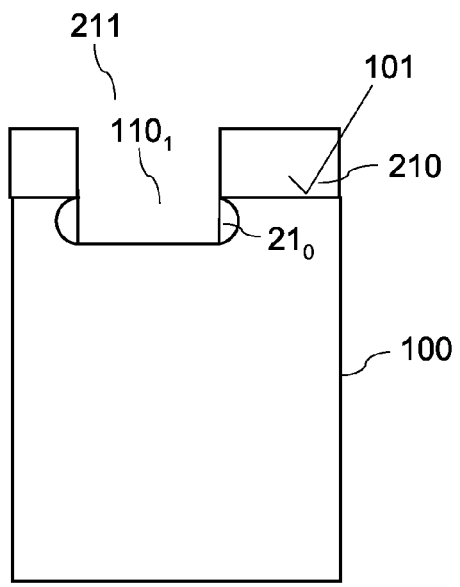

According to a further embodiment that is illustrated in FIGS. 10A and 10B, before forming the first trench $110_1$, an implant region $21_0$ is produced using the mask 210 as an implantation. FIG. 10A shows a vertical cross-sectional view of the semiconductor body 100 after forming the implant region $21_0$ below a bottom of the opening 211 of the mask 210. FIG. 10B shows the semiconductor body 100 after forming the first trench $110_1$. In this embodiment, the first trench $110_1$ is formed such that it does not completely extend through the implant region $21_0$. However, it is also possible to form the first trench such that it completely extends through the implant region $21_0$. Each of the process sequences explained herein before can be applied to the topology shown in FIG. 10B.

Figure 11:
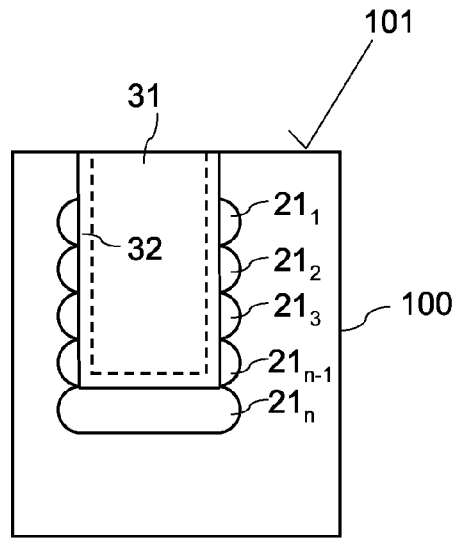
FIG. 11 shows a vertical cross-sectional view of a semiconductor body including doped semiconductor regions after further process steps.

Referring to FIG. 11, the trench $110_n$, and $110_{n+1}$, respectively, may at least partially be filled with a filling material 31. This filling material 31 may include at least one of a dielectric, a monocrystalline semiconductor material, a polycrystalline semiconductor material, and a metal. The monocrystalline or polycrystalline semiconductor material may have the same doping type as the doped region 20, may have a complementary doping type, or may be intrinsic. According to one embodiment, a diffusion barrier 32 (illustrated in dashed lines in FIG. 11) is formed on the bottom and the sidewalls of the trench $110_n$, before filling the trench. This diffusion barrier 32 prevents dopant atoms from diffusing from the implant regions $21_1$-$21_n$ into the filling material during the annealing process. The diffusion barrier may include at least one of an oxide (such $SiO_2$), boron nitride, and LPCVD (Low Pressure Chemical Vapor Deposition) nitride (such $Si_3N_4$).

Referring to the explanation above, the implantation and etch mask may include at least one of an oxide and a nitride. This implantation and etch mask 210 may be deposited on the first surface 101 in an oven process, or in an CVD (Chemical Vapor Deposition) process, in particular a PECVD (Plasma Enhanced Chemical Vapor Deposition) process. While an implantation and etch mask 210 produced in an oven process acts as a diffusion barrier, an implantation and etch mask 210 produced in a CVD process may allow dopant atoms implanted into the implantation and etch mask 210 to diffuse into the first surface 101. Thus, according to one embodiment, a diffusion barrier (not shown in FIGS. 1A-1E) is produced on the first surface 101 before the implantation and etch mask 210 is produced. This diffusion barrier may include one of the materials mentioned in connection with the diffusion barrier 32 herein before.

The doped semiconductor region 20 produced in accordance with one of the processes explained herein can be employed in a number of different semiconductor devices, in particular vertical semiconductor devices. Some embodiments of vertical semiconductor devices including such doped semiconductor region 20 are explained in the following.

Figure 12:
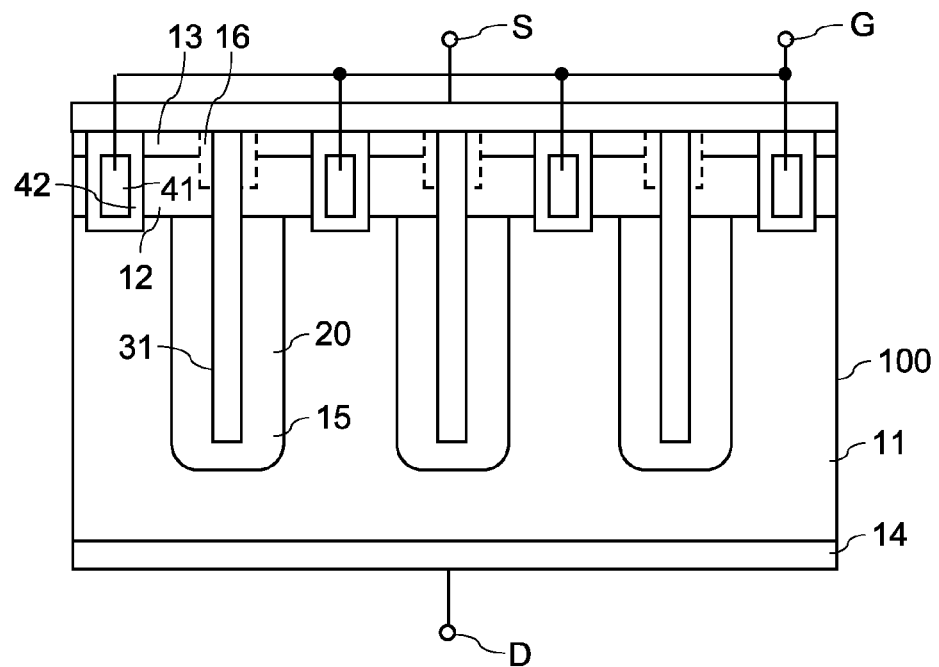
FIG. 12 shows a vertical cross-sectional view of an MOS transistor including compensation regions obtained in accordance with one of the methods shown in FIGS. 1-11.

FIG. 12 shows a vertical cross-sectional view of an MOS transistor. Referring to FIG. 10, the MOS transistor includes a semiconductor body 100 and a plurality of transistor cells integrated in the semiconductor body 100. Each transistor cell includes a body region 12 arranged between a source region 13 and a drift region 11, and a gate electrode 41 adjacent the body region 12 and dielectrically insulated from the body region 12 by a gate dielectric 42. The drift region 11 is arranged between the body region 12 and a drain region 14. Optionally (not illustrated), a field stop region of the same doping type as the drift region 11, but more highly doped than the drift region, is arranged between the drift region 11 and the drain region 14. In the embodiment shown in FIG. 12, the individual transistor cells share the drift region 11, and the drain region 14. The drain region 14 is coupled to a drain terminal D (that is only schematically illustrated), the source regions 13 and, optionally, the body regions 12 are connected to a source terminal S, and the gate electrodes 41 are connected to a gate terminal G.

The MOS transistor can be implemented as an n-type MOS transistor or as a p-type MOS transistor. In an n-type MOS transistor, the source region 13, and the drift region 11 are n-doped, and the body region 12 is p-doped. In a p-type MOS transistor, the source region 13, and the drift region 11 are p-doped, and the body region 12 is n-doped. The MOS transistor can be implemented as a MOSFET (Metal Oxide Semiconductor Field-Effect Transistor) or as an IGBT (Insulated Gate Bipolar Transistor). In a MOSFET, the drain region 14 has the same doping type as the drift region 11, and in an IGBT, the drain region 14 (which is also referred to as emitter region) is complementary to the drift region 11.

Referring to FIG. 12, the individual transistor cells further include compensation regions 15 of a doping type complementary to a doping type of the drift region 11, wherein each compensation region 15 adjoins the drift region 11 and forms a pn-junction with the drift region 11. These compensation regions 15 correspond to the semiconductor region 20 explained herein and have been formed in accordance with one of the processes explained hereinbefore. Forming the MOS transistor of FIG. 12 may include forming the compensation regions 15 in a semiconductor body 100 and forming the body regions 12, the source regions 13 and the gate electrodes 41 in the region of the first surface 101 of the semiconductor body 100.

Figure 13:
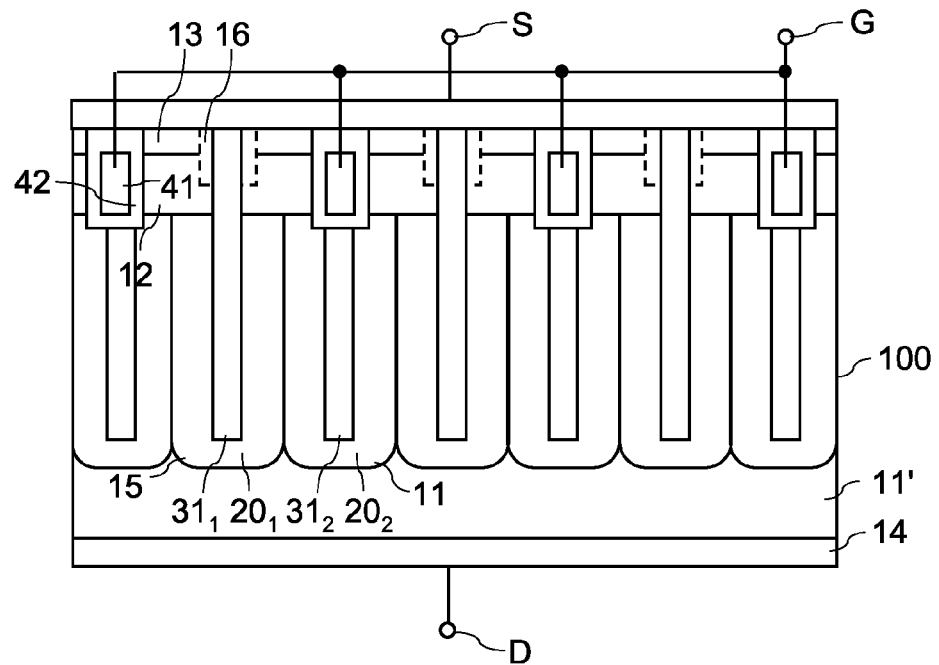
FIG. 13 illustrates a vertical cross-sectional view of an MOS transistor including compensation regions and drift region sections obtained in accordance with one of the methods explained with reference to FIGS. 1-11.

According to a further embodiment shown in FIG. 13, in addition to the compensation regions 15, the drift region 11 are doped semiconductor regions formed in accordance with one of the processes explained hereinbefore. The compensation regions 15 and the drift regions 11 are formed such that pn-junctions are formed between a compensation region 15 and a neighboring drift region. Forming the compensation regions 15 and the drift regions 11 may include a first process in which the compensation regions 15 are formed in the semiconductor body 100, and may include a second process in which the drift regions 11 are formed in a semiconductor body 100. Referring to FIG. 11, the MOS transistor may further include another drift region 11' between the compensation regions 15 and the drain region 14, and between the drift regions 11 and the drain region 14. This drift region 11' may have a doping concentration corresponding to a basic doping of the semiconductor body 100, i.e. a doping of the semiconductor body 100 before producing the compensation regions 15 and the drift regions 11.

Referring to FIGS. 10 and 11, the compensation regions 15 adjoin the body regions 12 or are electrically coupled thereto. The drift regions 11 adjoin a channel region, which is a region of the body region 12 along the gate dielectric 42.

In the embodiments shown in FIGS. 10 and 11, the gate electrodes 41 are implemented as trench electrodes, which are gate electrodes arranged in trenches of the semiconductor body 100. However, the MOS transistor may be implemented with an other type of gate electrode, such as a planar gate electrode, as well.

Figure 14:
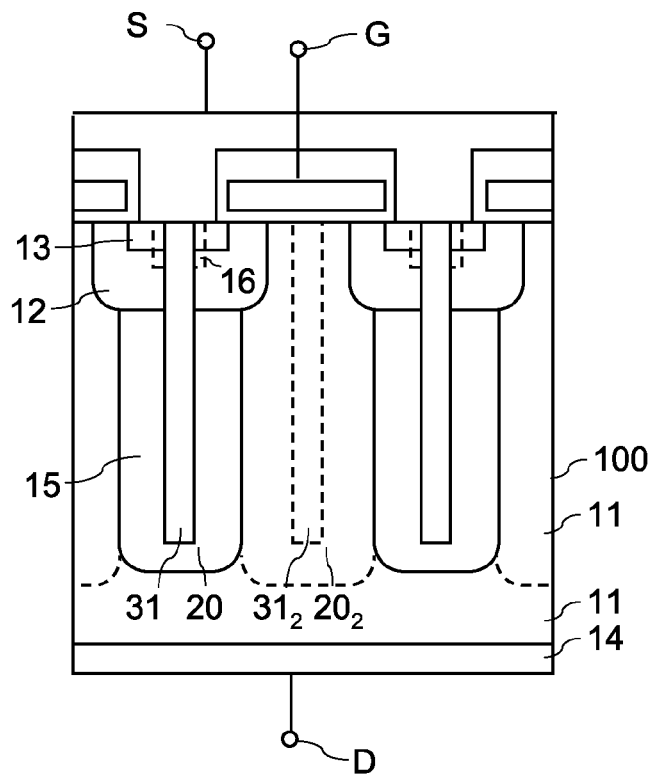
FIG. 14 illustrates a modification of the MOS transistors shown in FIGS. 12 and 13.

FIG. 14 shows a vertical cross-sectional view of an MOS transistor that includes transistor cells with a planar gate electrode 41. In this case, the gate electrode 41 is located above the first surface 101 of the semiconductor body 100. Like in the embodiments explained with reference to FIGS. 12 and 13, the MOS transistor may include compensation regions 15 and/or drift regions 11 produced in accordance with one of the methods explained hereinbefore.

In FIGS. 12, 13, and 14 reference characters 31, $31_1$, and $31_2$, respectively, denote a filling material that fills the trenches along which the compensation regions 15 and/or the drift regions 11 have been produced. According to one embodiment, this filling material includes a dielectric, such as an oxide, a LPCVD nitride, boron nitride (BN), aluminum nitride (AlN); DLC (Diamond Like Carbon); or a polycrystalline semiconductor material of a doping type complementary to the doping type of the drift region 11.

Figure 15:
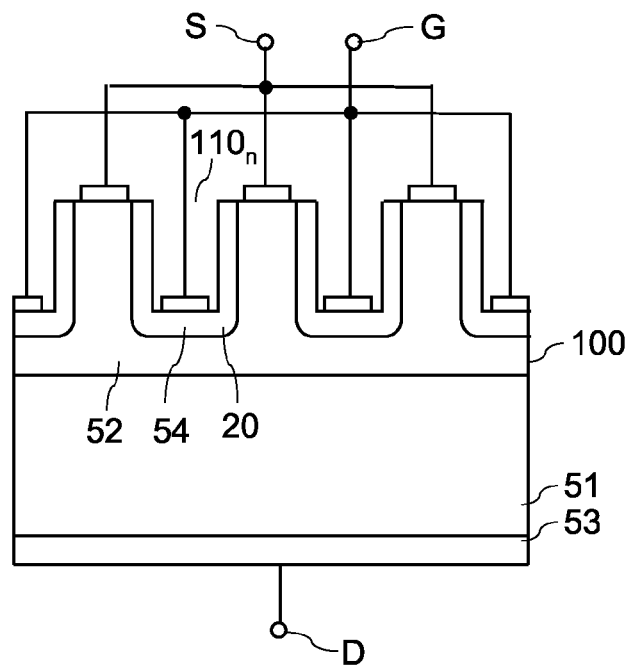
FIG. 15 illustrates a vertical cross-sectional view of a JFET (Junction Field-Effect Transistor) including a source region obtained in accordance with one of the methods shown in FIGS. 1-11.

FIG. 15 illustrates a vertical cross-sectional view of a JFET (Junction Field-Effect Transistor). This JFET includes a semiconductor body 100 in which a plurality of transistor cells are integrated. Each transistor cell includes a channel region 52, adjoining a drift region 51, and a drain region 53 adjoining the drift region 51. These regions 52, 51, 53 have the same doping type. Each transistor cell further includes a gate region 54 (channel control region) of a doping type complementary to the channel region 52 and forming a pn-junction with the channel region 52. The gate regions 54 correspond to the doped semiconductor regions 20 explained hereinbefore and are formed along a bottom and sidewalls of trenches $110_n$. In semiconductor mesa regions between neighboring trenches $110_n$, there are a channel region 52, and two gate regions 54 along opposite sidewalls of the mesa region. The channel regions 52 in the individual mesa regions are electrically coupled to a common source terminal S, the gate regions 54 are electrically coupled to a common gate terminal G, and the drain region 53 is coupled to a drain terminal D. In a conventional way, the gate terminal G can be biased such that the two gate regions 54 in each semiconductor mesa region pinch off the channel region 52 between the source terminal S and the drain terminal D, so as to switch off the semiconductor device.

Gate electrodes electrically coupled to the individual gate regions 54 are only schematically illustrated in FIG. 13. In this embodiment, the gate electrodes are located on the bottom of the trenches $110_n$. However, it is also possible to completely fill the trenches $110_n$ with an electrically conducting material which forms the gate electrode.

Figure 16:
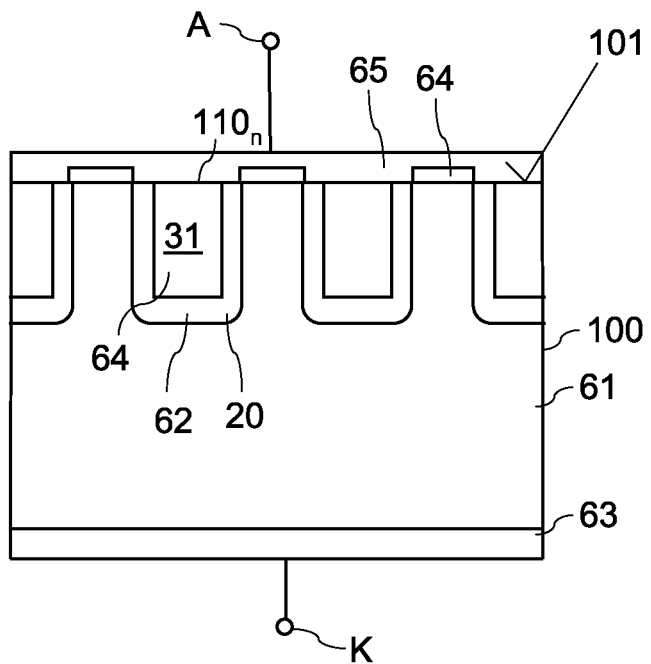
FIG. 16 illustrates a vertical cross sectional view of a SCR diode including an emitter region obtained in accordance with one of the methods shown in FIGS. 1-11.

FIG. 16 shows a vertical cross sectional view of a SCS (Surge Current Stable) diode (this type of diode is also referred to as MPS (Merged Pin Schottky) diode). This diode includes a semiconductor body 100 with an n-type base region 61, and an n-type emitter region 63 adjoining the base region 61. In the region of a first surface of the semiconductor body 100, Schottky metal electrodes are connected to the base region 61, and several p-emitter regions 62 extend from the first surface 101 into the base region 61. These p-emitter regions 62 are doped regions produced in accordance with one of the embodiments explained herein before, that is each of these p-emitter regions correspond to one doped region 20 explained before. These p-emitter regions are electrically coupled to an electrode 65 above the first surface 101. This electrode 65 that is also connected to the Schottky metal electrodes 64 forms an anode terminal A of the diode. The n-emitter is coupled to a cathode terminal K (that is only schematically illustrated in FIG. 16. The p-emitter regions are electrically connected to the electrode 65 through the filling material 31. In this case, the filling material 31 includes an electrically conductive material, such as a metal, a metal alloy, or a highly doped polycrystalline semiconductor material (such as pol-ysilicon).

The diode illustrated in FIG. 16 combines a Schottky diode and a bipolar diode. The diode conducts a current when a voltage applied between the anode and the cathode terminal A, K forward biases the Schottky junction between the Schottky metal electrodes 54 and the base region. This voltage is usually lower than a voltage that forward biases the pn junctions between the p-emitter regions and the base region 61. The diode blocks when a voltage is applied between the anode and cathode terminals that reverse biases the Schottky junctions and pn junctions. In this case, space charge regions (depletion regions) expand from the pn junctions and pinch off mesa regions on top of which the Schottky metal electrodes 54 contact the base region. Thus, the pn junctions provide for a high voltage blocking capability. Further, in the forward biased mode, the p-emitter regions 20, 62 inject charge carriers into the base region 61 when a voltage at the Schottky junction substantially corresponds to a diffusion voltage of the pn junction between the p-emitter regions 20, 62 and the base region 61. This helps to limit the forward voltage of the device. That is, the device is "surge current stable."

Figure 17:
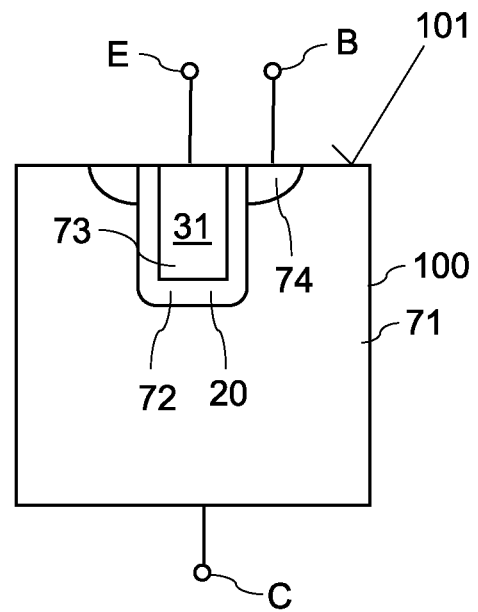
FIG. 17 illustrates a vertical cross sectional view of a bipolar transistor including base and emitter regions obtained in accordance with one of the methods shown in FIGS. 1-11.

FIG. 17 illustrates a vertical cross sectional view of a bipolar transistor that includes a base region 72, and an emitter region 73 obtained in accordance with one of the methods explained with reference to FIGS. 1-11 herein before. The base region 72 corresponds to the doped region 20 explained herein before, and the emitter region 73 corresponds to the filling material 31. In this case, the filling material includes a monocrystalline semiconductor material of a doping type complementary to the doping type of the base region 72. The emitter region 73 can be formed by epitaxially growing a semiconductor material in the trench ($110_n$ or $110_{n+1}$) after forming the doped region 120.

Referring to FIG. 17, the transistor may further include a base contact region 74 adjoining the base region 72 in the region of the first surface 101 of the semiconductor body 100. This base contact region 74 can be formed using at least one of an implantation and diffusion process. The base contact region 74 may have a higher doping concentration than the base region 72.

A collector region 71 of the bipolar transistor is formed by a semiconductor region sur-rounding the base region 72. The collector region 71 has a doping type complementary to a doping type of the base region 72. According to one embodiment, a doping of the collector region 71 corresponds to a (basic) doping of the semiconductor body 100 in those regions in which the doped region 20 forming the base region 72 is formed.

Referring to FIG. 17, the emitter region 73 is coupled to an emitter terminal E, the base region 72 or the base contact region 74, respectively, is coupled to a base terminal, and the collector region is coupled to a collector terminal C. These terminals are only schematically illustrated in FIG. 16. According to one embodiment, the base and emitter regions 72, 73 are con-tacted at the first surface 101 of the semiconductor body 100, and the collector region 71 is con-tacted at the second surface opposite the first surface 101.

Figure 18:
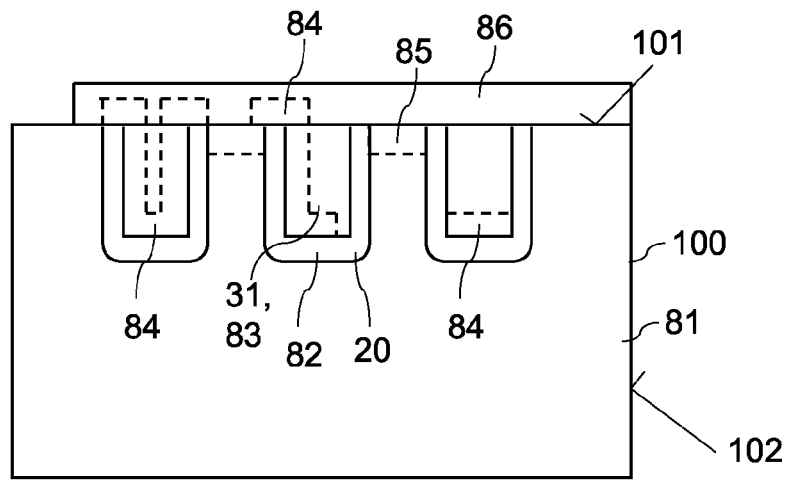
FIG. 18 illustrates a vertical cross sectional view of an edge termination structure including field rings obtained in accordance with one of the methods shown in FIGS. 1-11.

FIG. 18 shows a vertical cross sectional view of an edge termination structure. This edge termination structure can be arranged between active device regions (not shown in FIG. 18) of a vertical semiconductor device and an edge surface 102 of a semiconductor body 100. The edge termination structure may surround the active device regions in a horizontal plane (which is perpendicular to the plane shown in FIG. 18). The edge termination structure shown in FIG. 18 includes several (namely three in this embodiment) field rings 82 that are mutually spaced in a horizontal direction of the semiconductor body 100, and that each correspond to one doped region 20 explained before. The individual field rings 82 have a doping type that is complementary to a doping type of a semiconductor region 81 that adjoins the field rings 82, and that may have a doping that corresponds to a basic doping of the semiconductor body 100. The filling material 31, 83 is an electrically or dielectrically insulating material according to one embodiment, and may include at least one of an oxide, a nitride, and a composition thereof. The filling material acts as a passivation layer. A further passivation layer that is located above the first surface 101 may include the same material as the filling material 31 in the trenches, or may include a different material.

Optionally, there are implantation regions 85 of the same doping type as the field rings 82 between the individual field rings 82, and adjoining the first surface 101. Further, field plates are optionally located on the field rings 82 in the trenches. These field rings can be implemented in different ways. Three possible embodiments are shown in FIG. 18. The field plate 84 may cover only the bottom of the trench in which the field ring 82 is formed, may cover only one sidewall of the trench and a section of the bottom, or may cover the sidewalls and the bottom of the trench. The field plates 84 may include an electrically conducting material, such as a metal or a highly doped polycrystalline semiconductor material.

Figure 19A:
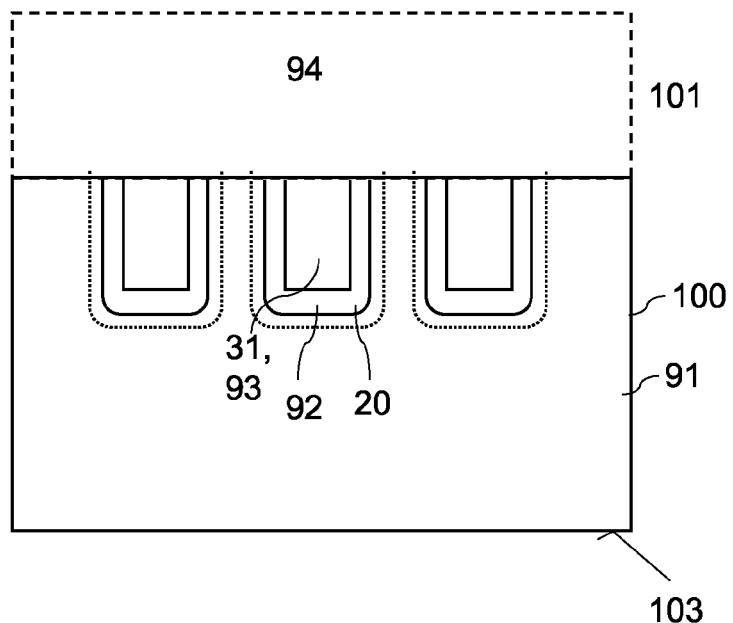
FIGS. 19A-19B illustrate a method for etching a semiconductor substrate using a depletion region around a doped region as an etch stop.
Figure 19B:
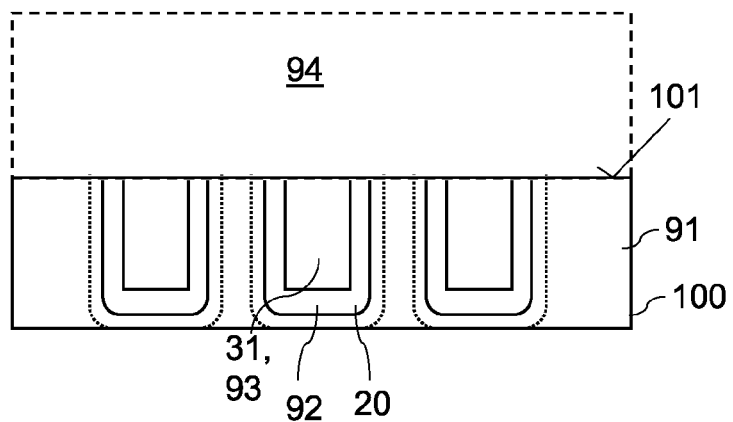

FIGS. 19A and 19B show vertical cross sectional views of a semiconductor body 100 during an etching process. Referring to FIG. 19A, the semiconductor body 100 includes a semiconductor substrate 91 that has a basic doping of the first doping type, and at least one doped semiconductor region 92 of a second doping type complementary to the first doping type. This at least one doped semiconductor region 92 corresponds to one of the doped regions 20 explained with reference to FIGS. 1-11 herein before. The filling material 31, 93, that fills the trench along the sidewalls and the bottom of which the doped region 93 has been produced, includes a monocrystalline semiconductor material of the first doping type. Optionally, the semiconductor body 100 further includes an epitaxial layer 94 of the first doping type on the first surface 101 of the semiconductor substrate 91.

Referring to FIG. 19A, the doped semiconductor region 92, in particular the bottom section of the doped semiconductor region 92, is spaced apart from a second surface 102 opposite the first surface 101.

Referring to FIG. 19B, the semiconductor substrate is etched back from the second surface, so as to reduce a thickness of the substrate 91. However, it is desired for the etching process not to etch the doped semiconductor region 92. This can be obtained by applying a voltage between the doped region 92 and the substrate 91 that reverse biases the pn junction between the doped region 92 and the substrate, and by using an etchant, such as KOH (potassium hydroxide) or TMAH (Tetramethylammonium hydroxide), that stops when the etched surface reaches a depletion region. Reverse biasing the pn junction generates a depletion region (illustrated in dotted lines in FIG. 19B) along the doped region, so that the etching process stops when etched second surface 103 reaches the depletion region below the at least one trench with the doped region 92.

According to one embodiment, the doped region is an emitter region of an RC (reverse conducting) IGBT (Insulated gate bipolar transistor). In this case, the epitaxial layer forms a base region of the IGBT. Further device regions, such as a source region, and a body region, arranged in the epitaxial layer, and a gate electrode, and gate dielectric are not shown in FIG. 19B.

Referring to the embodiments explained herein before, the impurity atoms implanted into the trench bottom can be electrically active dopant atoms that form n-type or p-type semiconductor regions. However, it is also possible to implant other types of impurity atoms, namely non-doping impurity atoms, such as heavy metal atoms. Implant regions that include heavy metal atoms may act as recombination regions in a semiconductor device. Suitable heavy metal atoms are, for example, gold (Au), platinum (Pt), or molybdenum (Mo) atoms.

In the description hereinbefore, directional terminology, such as "top," "bottom," "front," "back," "leading," "trailing" etc., is used with reference to the orientation of the figures being described. Because components of embodiments can be positioned in a number of different ori-entations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate proces-sor instructions, or in hybrid implementations that utilize a combination of hardware logic and software logic to achieve the same results. Such modifications to the inventive concept are intended to be covered by the appended claims.

As used herein, the terms "having," "containing," "including," "comprising" and the like are open ended terms that indicate the presence of stated elements or features, but do not pre-clude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

It is to be understood that the features of the various embodiments described herein may be combined with each other, unless specifically noted otherwise.

The invention claimed is:

1. A method, comprising:
   forming a trench in a first surface of a semiconductor body;
   implanting impurity atoms into a bottom of the trench to form a first implant region;
   extending the trench deeper into the semiconductor body, thereby forming a deeper trench;
   implanting impurity atoms into a bottom of the deeper trench to form a further implant region; and;
   after forming the further implant region, annealing the first implant region and the further implant region to diffuse impurity atoms from the first implant region and the further implant region into the semiconductor body.

2. The method of claim 1, wherein the impurity atoms in at least one of the implanting include dopant atoms.

3. The method of claim 1, wherein the impurity atoms in at least one of the implanting include non-doping atoms.

4. The method of claim 3, wherein the non-doping atoms are heavy metal atoms.

5. The method of claim 1, further comprising:
   repeating the step of extending the trench and the step of implanting dopant atoms into a bottom of the deeper trench at least once.

6. The method of claim 1, wherein the impurity atoms implanted into the bottom of the trench, and the impurity atoms implanted into the bottom of the deeper trench are dopant atoms which have the same doping type.

7. The method of claim 1, wherein the impurity atoms implanted into the bottom of the trench, and the impurity atoms implanted into the bottom of the deeper trench are dopant atoms which have complementary doping types.

8. The method of claim 7, wherein the dopant atoms implanted into the bottom of the respective trenches are used to form two implant regions of complementary doping type at different vertical positions of the semiconductor body.

9. The method of claim 1,
wherein at least one of implanting the impurity atoms into the bottom of the trench and implanting the impurity atoms into the bottom of the deeper trench comprises at least two implantation processes, and
wherein impurity atoms are implanted with different implantation energies in the at least two implantation processes.

10. The method of claim 1, further comprising:
forming the scattering layer on the bottom of the deeper trench before implanting the impurity atoms into the bottom of the deeper trench.

11. The method of claim 1, further comprising:
at least partially filling the deeper trench with a filling material.

12. The method of claim 11, wherein the filling material comprises at least one material selected from the group consisting of:
a dielectric material;
a polycrystalline semiconductor material;
a monocrystalline semiconductor material; and
a metal.

13. The method of claim 11, further comprising:
forming a diffusion barrier on at least one of the bottom and sidewalls of the deeper trench before at least partially filling the deeper trench.

14. The method of claim 1, further comprising:
before at least one of implanting impurity atoms into the bottom of the trench, and implanting impurity atoms into the bottom of the deeper trench forming a scattering layer at least on the bottom.

15. The method of claim 14, wherein the scattering layer is one of a thermally grown oxide layer, and a deposited oxide layer.

16. The method of claim 14, further comprising:
forming a body region adjoining the doped semiconductor region;
forming a source region in the body region; and
forming a gate electrode dielectrically insulated from the body region by a gate dielectric.

17. The method of claim 1,
wherein a region of the semiconductor body in which the trench is formed has a first doping type; and
wherein the impurity atoms are dopant atoms having a second doping type.

18. The method of claim 1, further comprising:
forming a plurality of trenches spaced apart from each other in the semiconductor body.

19. A method, comprising:
forming a trench in a first surface of a semiconductor body;
implanting impurity atoms into a bottom of the trench;
extending the trench deeper into the semiconductor body, thereby forming a deeper trench;
implanting impurity atoms into a bottom of the deeper trench; and
forming a scattering layer on at least one of the bottom of the trench and the bottom of the deeper trench without forming the scattering layer on sidewalls of these trenches,
wherein at least one of implanting impurity atoms into the bottom of the trench and implanting impurity atoms into the bottom of the deeper trench comprises implanting the respective impurity atoms into the scattering layer.

20. A method, comprising:
forming a trench in a first surface of a semiconductor body;
implanting dopant atoms into a bottom of the trench to form a first implant region;
extending the trench deeper into the semiconductor body, thereby forming a deeper trench;
implanting dopant atoms into a bottom of the deeper trench to form a further implant region; and
after forming the further implant region, annealing the first implant region and the second implant region to diffuse dopant atoms from the first implant region and the further implant region into the semiconductor body, and to activate the dopant atoms.

* * * * *